(12) United States Patent
Byun (10) Patent No.: US 8,400,851 B2
(45) Date of Patent: Mar. 19, 2013

(54) OUTPUT ENABLE SIGNAL GENERATION CIRCUIT OF SEMICONDUCTOR MEMORY

(75) Inventor: Hee Jin Byun, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 171 days.

(21) Appl. No.: 12/980,028

(22) Filed: Dec. 28, 2010

(65) Prior Publication Data
US 2012/0002493 A1   Jan. 5, 2012

(30) Foreign Application Priority Data
Jul. 2, 2010  (KR) .......................... 10-2010-0063998

(51) Int. Cl.
*G11C 7/00* (2006.01)

(52) U.S. Cl. ................ 365/193; 365/230.06; 365/233.1; 365/194

(58) Field of Classification Search .................. 365/193, 365/230.06, 233.1, 194
See application file for complete search history.

(56) References Cited

U.S. PATENT DOCUMENTS

| 7,257,183 | B2 | 8/2007 | Dally et al. |
| 2003/0218921 | A1 | 11/2003 | Schrogmeier et al. |
| 2004/0008064 | A1 | 1/2004 | Kashiwazaki |
| 2005/0262373 | A1 | 11/2005 | Kim |
| 2006/0092721 | A1* | 5/2006 | Lee ............................ 365/191 |

FOREIGN PATENT DOCUMENTS

| JP | 09-167485 | 6/1997 |
| JP | 11-213660 | 8/1999 |
| KR | 102002-0058519 A | 7/2002 |
| KR | 1020090088120 A | 8/2009 |

* cited by examiner

*Primary Examiner* — Jason Lappas (74) *Attorney, Agent, or Firm* — William Park & Associates Ltd.

(57) ABSTRACT

An output enable signal generation circuit of a semiconductor memory includes: a latency signal generation unit configured to generate a latency signal for designating activation timing of a data output enable signal in response to a read signal and a CAS latency signal; and a data output enable signal generation unit configured to control the activation timing and deactivation timing of the data output enable signal in response to the latency signal and a signal generated by shifting the latency signal based on a burst length (BL).

9 Claims, 9 Drawing Sheets

OUTPUT ENABLE SIGNAL GENERATION CIRCUIT OF SEMICONDUCTOR MEMORY

CROSS-REFERENCES TO RELATED APPLICATION

The present application claims priority under 35 U.S.C. §119(a) to Korean Application No. 10-2010-0063998, filed on Jul. 2, 2010, in the Korean Intellectual Property Office, which is incorporated herein by reference in its entirety as if set forth in full.

BACKGROUND

1. Technical Field

The present invention relates to a semiconductor memory, and more particularly, to an output enable signal generation circuit of a semiconductor memory.

2. Related Art

A semiconductor memory uses an output enable signal to decide a window of data outputted based on a read operation. The output enable signal is generated within the semiconductor memory and used therein.

Figure 1:
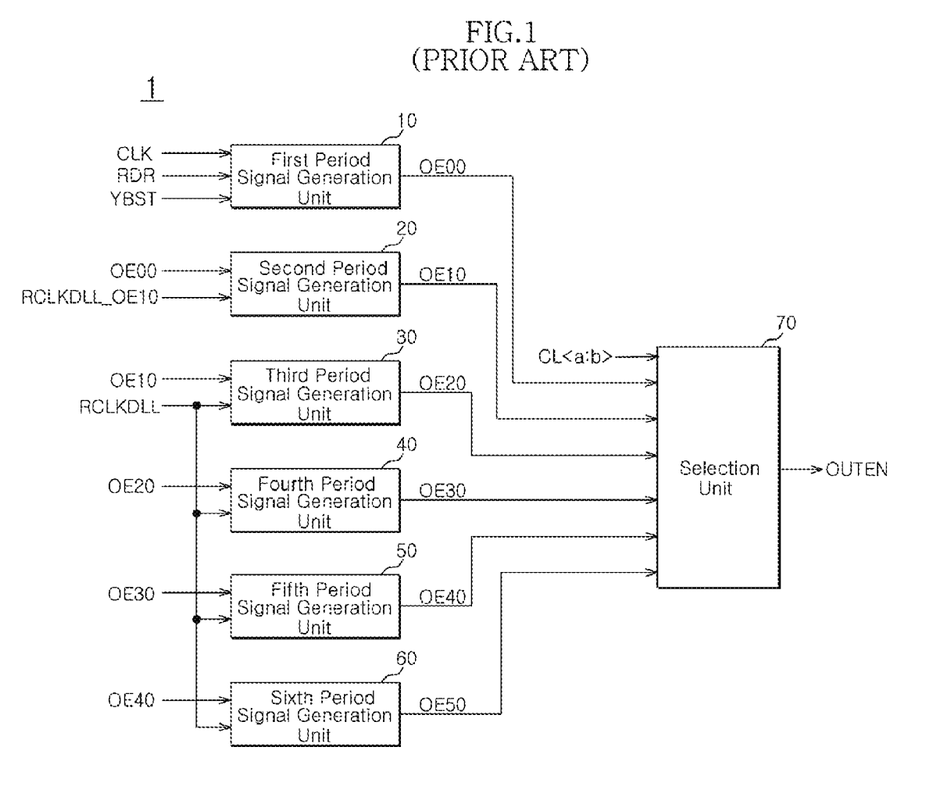
FIG. 1 is a block diagram of an output enable signal generation circuit of a conventional semiconductor memory.

FIG. 1 is a block diagram of an output enable signal generation circuit of a conventional semiconductor memory. Referring to FIG. 1, an output enable signal generation circuit 1 of a conventional semiconductor memory includes first to sixth period signal generation units 10 to 60 and a selection unit 70.

The first period generation unit 10 is configured to logically combine a clock signal CLK, a read signal RDR, and a burst signal YBST and generate a period signal OE00.

The read signal RDR is generated using a read command, and the burst signal YBST is generated based on a burst length (BL).

The second period signal generation unit 20 is configured to shift the period signal OEOO based on a clock signal RCLKDLL_OE10 and generate a period signal OE10.

The clock signal RCLKDLL_OE10 is obtained by delaying a delay locked loop (DLL) clock signal RCLKDLL by a preset time.

The third to sixth period signal generation units 30 to 60 are configured to shift period signals OE10 to OE40 based on the DLL clock signal RCLKDLL and generate period signals OE20 to OE50.

The selection section 70 is configured to select one of the period signals OE10 to OE50 based on a CAS latency (CL) and output the selected period signal as an output enable signal OUTEN.

Figure 2:
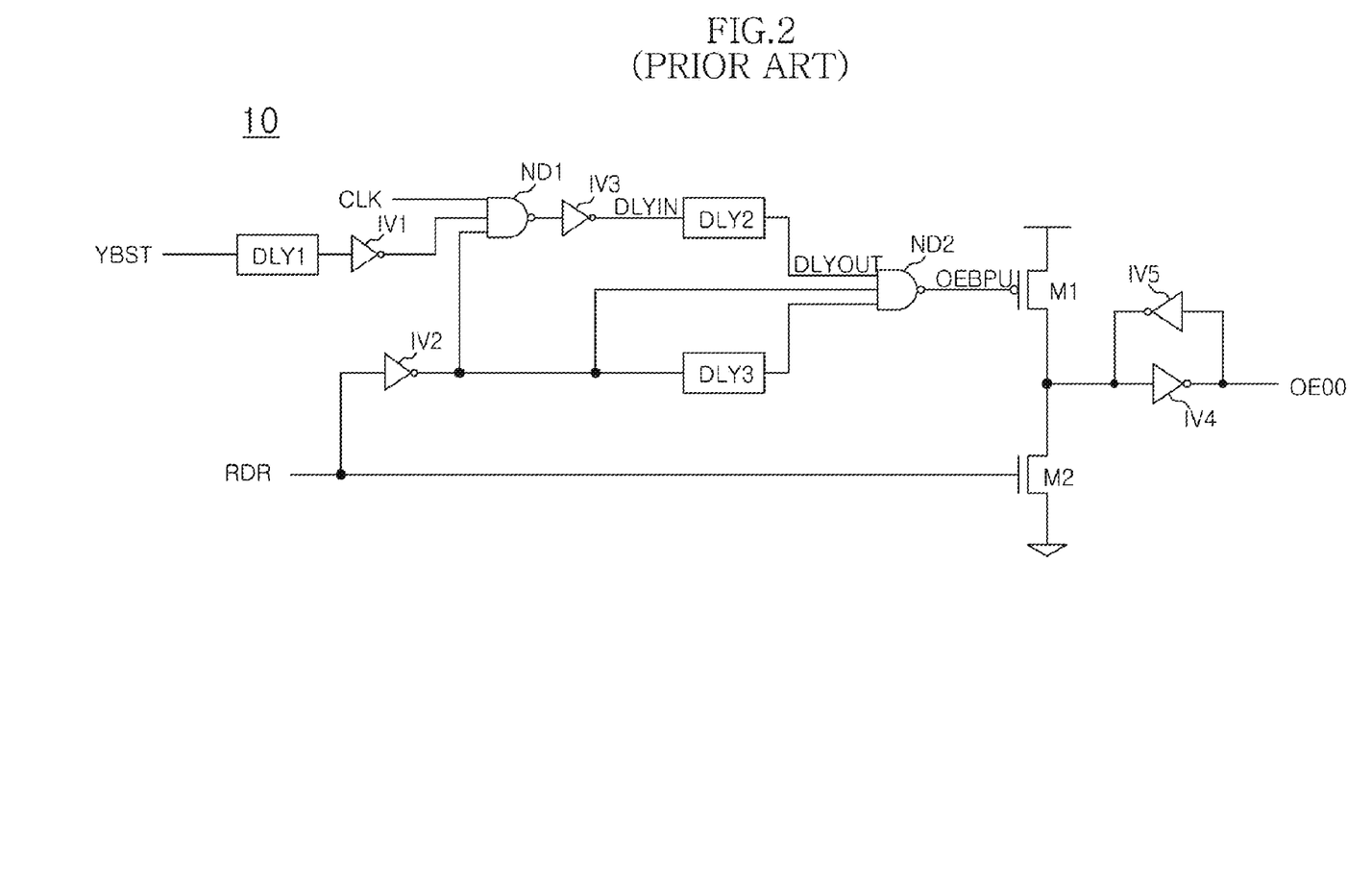
FIG. 2 is a circuit diagram of a first period signal generation unit of FIG. 1.

FIG. 2 is a circuit diagram of a first period signal generation unit of FIG. 1. Referring to FIG. 2, the first period signal generation unit 10 includes a plurality of delays DLY1 to DLY3, a plurality of inverters IV1 to IV5, a plurality of NAND gates ND1 and N2, and a plurality of transistors M1 and M2.

The first period signal generation unit 10 enables the period signal OE00 based on the read signal RDR, and disables the period signal OE00 based on a result obtained by logically combining the burst signal YBST and the clock signal CLK.

Figure 3:
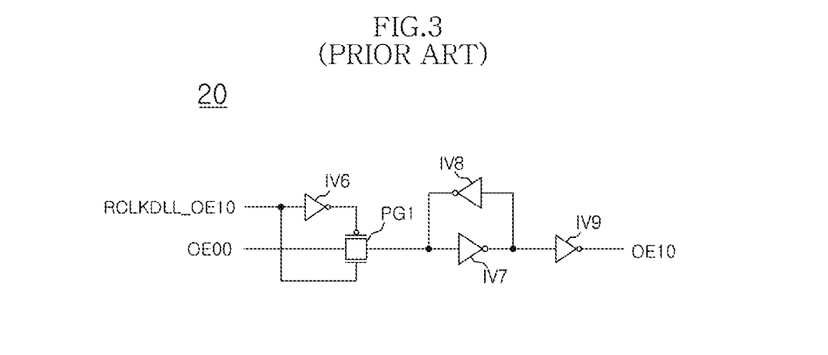
FIG. 3 is a circuit diagram of a second period signal generation unit of FIG. 2.

FIG. 3 is a circuit diagram of a second period signal generation unit of FIG. 2. Referring to FIG. 3, the second period signal generation unit 20 includes a plurality of inverters IV6 to IV9 and a pass gate PG1.

The second period signal generation unit 20 shifts the period signal OE00 based on a clock signal RCLKDLL_OE10 and generates the period signal OE10.

The third to sixth period signal generation units 30 to 60 may be configured in the same manner as the second period signal generation unit 20.

The plurality of delays DLY1 to DLY3 of the first period signal generation unit 10 are configured to secure the timing margins of internal signals for enabling the period signal OE00.

The delay DLY1 secures the margins of the clock signal CLK and the burst signal YBST. Thus, referring to FIG. 4, a high level period of the burst signal YBST should block the clock signal of a burst operation period. Therefore, a falling edge of the burst signal YBST always occurs after the high level period of the clock signal CLK which should be blocked as the delay DLY1 is configured to delay the burst signal YBST.

The delay DLY2 secures the margin of a time point at which the period signal OE00 coincides with the clock signal RCLKDLL_OE10, in order to generate the period signal OE00.

Figure 4:
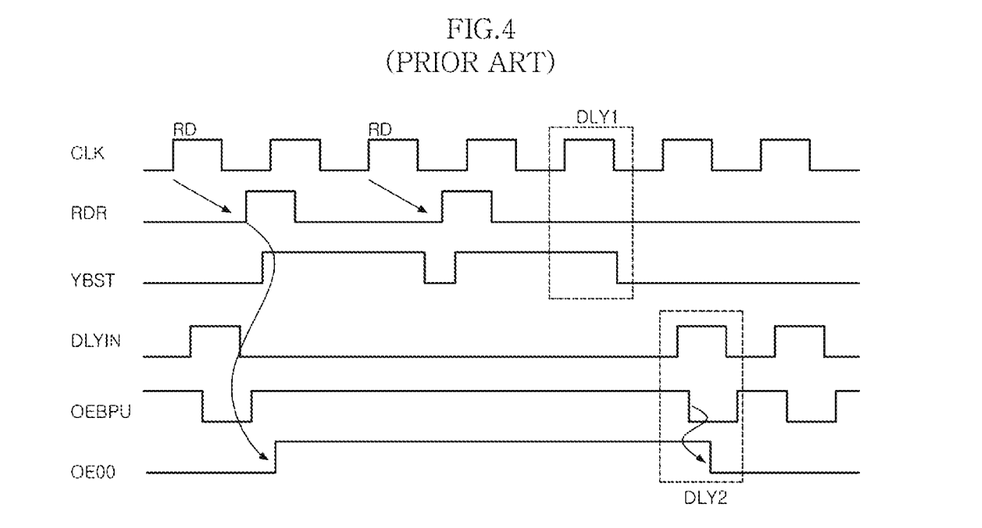
FIGS. 4 to 6 are timing diagrams explaining the operations of a plurality of delays in the conventional semiconductor memory and a problem which occurs therein.
Figure 5:
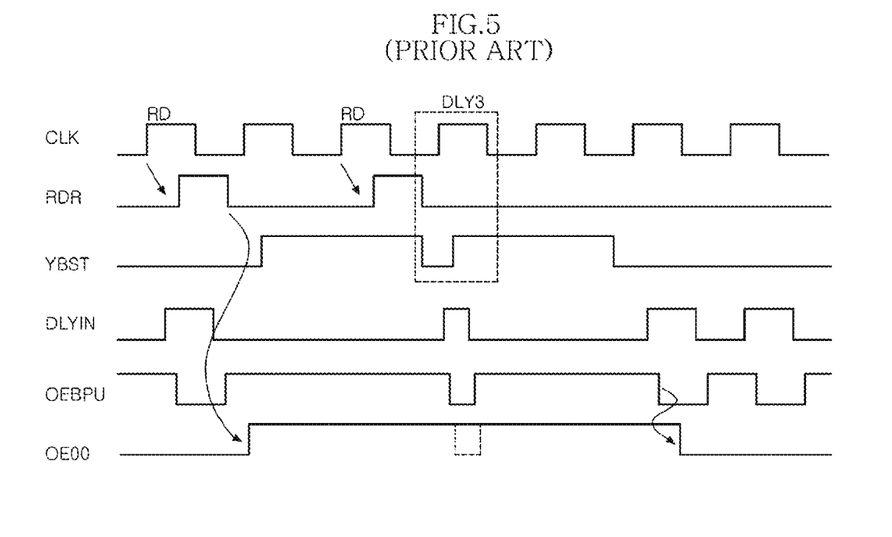
Figure 6:
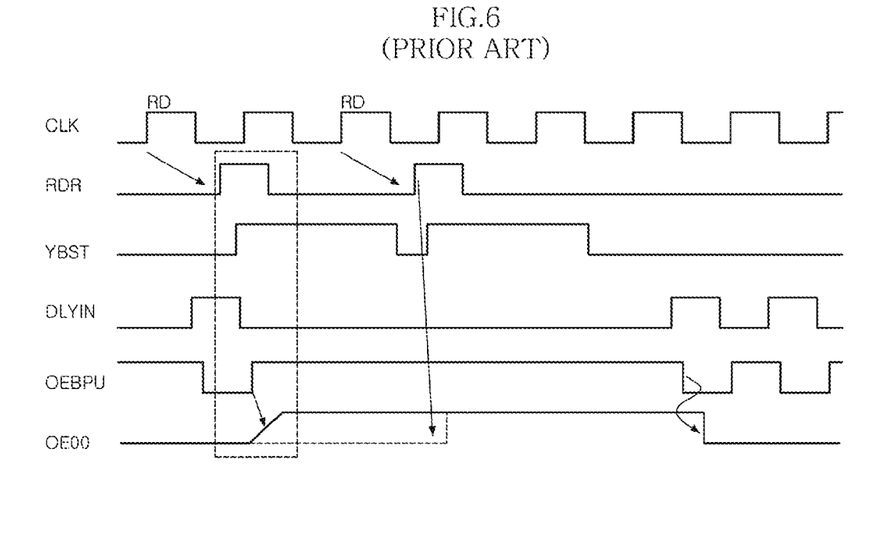

FIGS. 4 to 6 are timing diagrams explaining the operations of a plurality of delays in the conventional semiconductor memory and a problem which occurs therein. Referring to FIG. 5, the read signal RDR may be generated earlier than in FIG. 4, and the burst signal YBST may be much delayed by the delay DLY2. In this case, the delay DLY3 is used to prevent the period signal OE00 from transiting to a low level by a high-level signal DLYOUT although the read signal RDR is inverted by the inverter IV2.

Referring to FIG. 6, however, when the delay time of the second delay DLY2 is set to an excessively large value to secure a margin and the read signal RDR overlaps the low level period of a signal OEBPU (refer to FIG. 2), a rising edge of the period signal OE00 may not be accurately generated or the activation thereof may not occur.

In the above-described output enable signal generation circuit 1 of conventional semiconductor memory, the configuration for controlling the activation and deactivation of the period signal is implemented within one circuit.

Therefore, a trade-off problem occurs in which when a margin for any one of the activation time and deactivation time of the period signal is secured, a margin for the other is reduced. As a result, the clock signal and the operation voltage are limited and degrade the characteristic of circuit operation.

SUMMARY

An output enable signal generation circuit of a semiconductor memory which may secure both activation and deactivation margins of a period signal is described herein.

In one embodiment, an output enable signal generation circuit of a semiconductor memory includes: a latency signal generation unit configured to generate a latency signal for designating activation timing of a data output enable signal in response to a read signal and a CAS latency signal; and a data output enable signal generation unit configured to control the activation and deactivation timings of the data output enable signal in response to the latency signal and a signal generated by shifting the latency signal based on a burst length (BL).

In another embodiment, an output enable signal generation circuit of a semiconductor memory includes: a selection unit configured to select any one signal corresponding to a CAS latency signal among a plurality of preliminary latency signals having different activation timings, and output the selected signal as a latency signal; a plurality of shifters configured to sequentially shift the latency signal based on a clock signal and generate shifted signals; and a combination unit configured to logically combine the latency signal and the shifted signals and generate a data output enable signal.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Reference will now be made in detail to the exemplary embodiments consistent with the present disclosure, examples of which are illustrated in the accompanying drawings. Wherever possible, the same reference characters will be used throughout the drawings to refer to the same or like parts.

Figure 7:
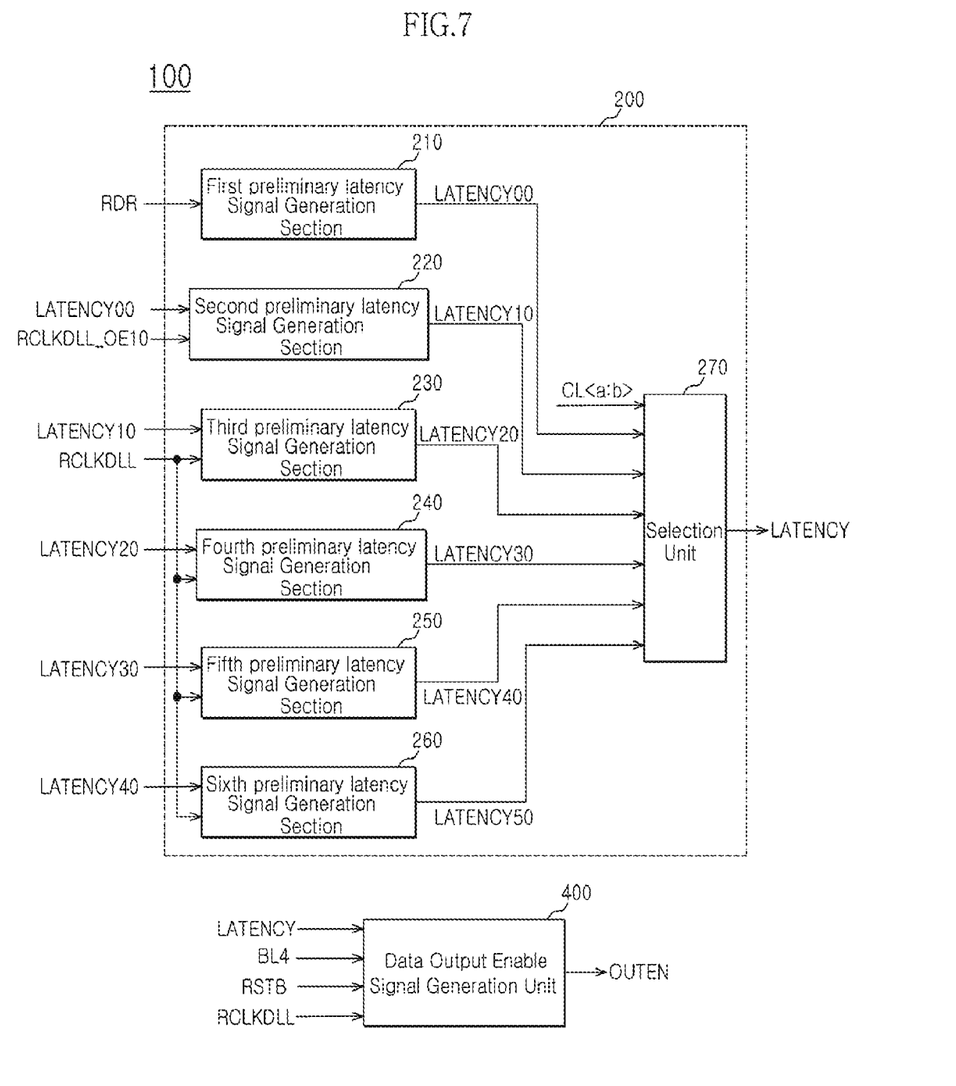
FIG. 7 is a block diagram of an output enable signal generation circuit of a semiconductor memory according to one embodiment.

FIG. 7 is a block diagram of an output enable signal generation circuit of a semiconductor memory according to one embodiment. Referring to FIG. 7, an output enable signal generation circuit 100 of a semiconductor memory according to one embodiment includes a latency signal generation unit 200 and a data output enable signal generation unit 400.

The latency signal generation unit 200 is configured to generate a latency signal LATENCY which designates the activation timing of a data output enable signal OUTEN in response to a read signal RDR and a CAS latency signal CL<a:b>.

The latency signal generation unit 200 includes a plurality of preliminary latency signal generation sections, first to sixth preliminary latency signal generation sections 210 to 260, and a selection section 270.

The first to sixth preliminary latency signal generation sections 210 to 260 are configured to receive the read signal RD, a clock signal RCLKDLL, and a delayed clock signal RCLKDLL_OE10 and generate a plurality of preliminary latency signals LATENCY00 to LATENCY50 which are sequentially activated.

The delay clock signal RCLKDLL_OE10 is obtained by delaying the clock signal RCLKDLL by a predetermined time.

The selection section 270 is configured to select one of the preliminary latency signals LATENCY00 to LATENCY50 and output the selected signal as the latency signal LATENCY in response to the CAS latency signal CL<a:b>.

The data output enable signal generation unit 400 is configured to receive the latency signal LATENCY, a burst length (BL) signal BL4, a reset signal RSTB, and the clock signal RCLKDLL and generate the data output enable signal OUTEN.

Figure 8:
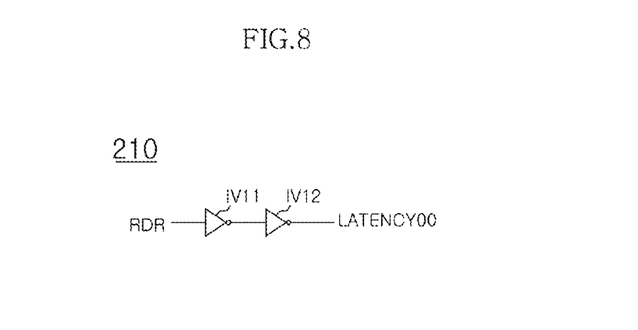
FIG. 8 is a circuit diagram of a first preliminary latency signal generation section of FIG. 7.

FIG. 8 is a circuit diagram of a first preliminary latency signal generation section of FIG. 7. Referring to FIG. 8, the first preliminary latency signal generation unit 210 is configured to repeat the read signal RDR using repeaters IV1 and IV2 and generate the preliminary latency signal LATENCY00.

Figure 9:
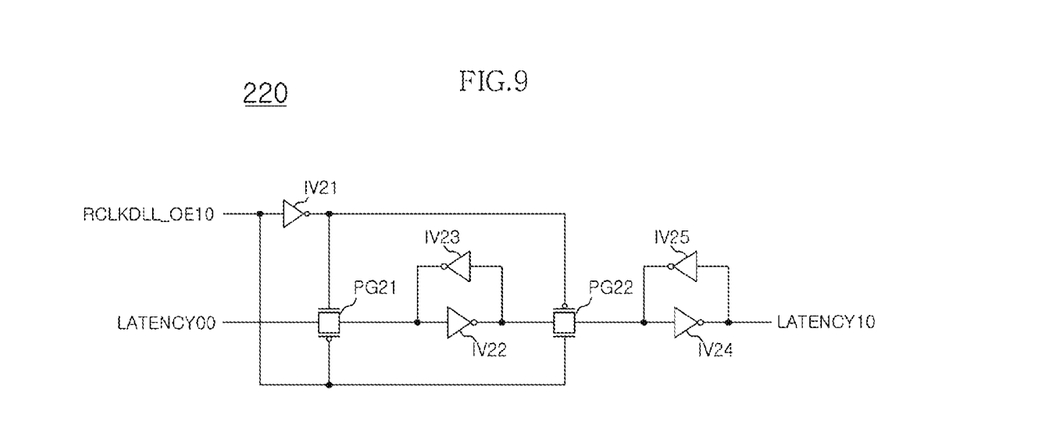
FIG. 9 is a circuit diagram of a second preliminary latency signal generation section of FIG. 7.

FIG. 9 is a circuit diagram of a second preliminary latency signal generation section of FIG. 7. Referring to FIG. 9, the second preliminary latency signal generation unit 220 is configured to latch the preliminary latency signal LATENCY00 by one period of the delayed clock signal RCLKDLL_OE10 and generate the preliminary latency signal LATENCY10.

The second preliminary latency signal generation unit 220 includes a plurality of inverters IV21 to IV25 and a plurality of pass gates PG21 and PG22.

The third to sixth preliminary latency signal generation units 230 to 260 may be configured in the same manner as the second preliminary latency signal generation unit 220, except that they use the clock signal RCLKDLL instead of the delayed clock signal RCLKDLL_OE10.

Figure 10:
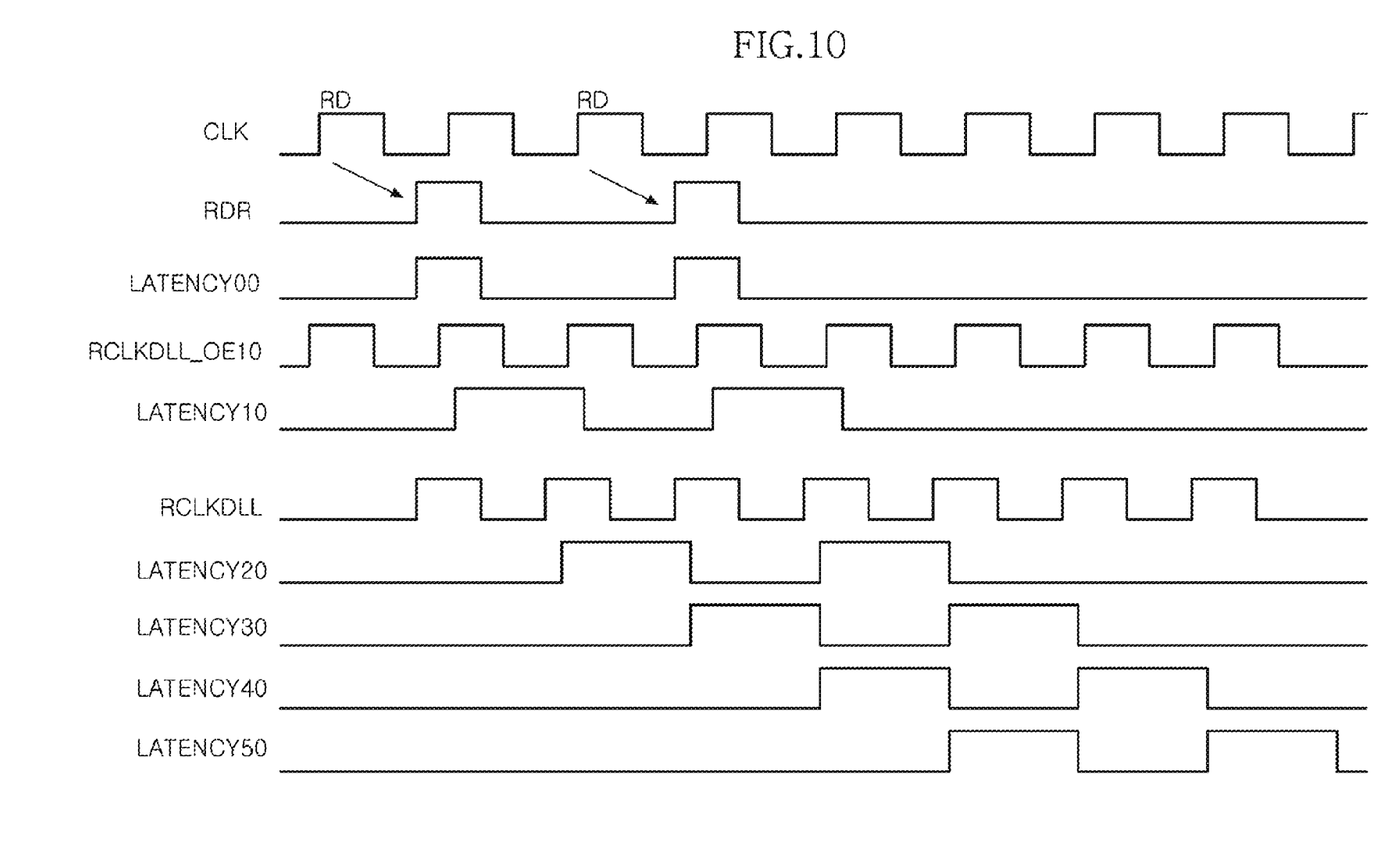
FIG. 10 is a timing diagram of latency signals according to the embodiment.

FIG. 10 is a timing diagram of latency signals according to the embodiment. Referring to FIG. 10, the read signal RDR is generated as a read command RD is inputted on the basis of an external clock signal CLK.

The first preliminary latency signal generation unit 210 repeats the read signal RDR and generates the preliminary latency signal LATENCY00.

The second preliminary latency signal generation unit 220 latches the preliminary latency signal LATENCY00 by one period of the delayed clock signal RCLKDLL_OE10 and generates the preliminary latency signal LATENCY10.

At this time, the preliminary latency signal LATENCY00 is a is pulse signal having a pulse width corresponding to or less than the pulse width of the external clock signal CLK. Therefore, the preliminary latency signal LATENCY10 may have a larger pulse width than the preliminary latency signal LATENCY00 through the second preliminary latency signal generation unit 220 in order to stably secure a margin.

The third to sixth preliminary latency signal generation units 230 to 260 latch the preliminary latency signals LATENCY10 to LATENCY40 by one period of the clock signal RCLKDLL and generate the preliminary latency signals LATENCY20 to LATENCY50.

Figure 11:
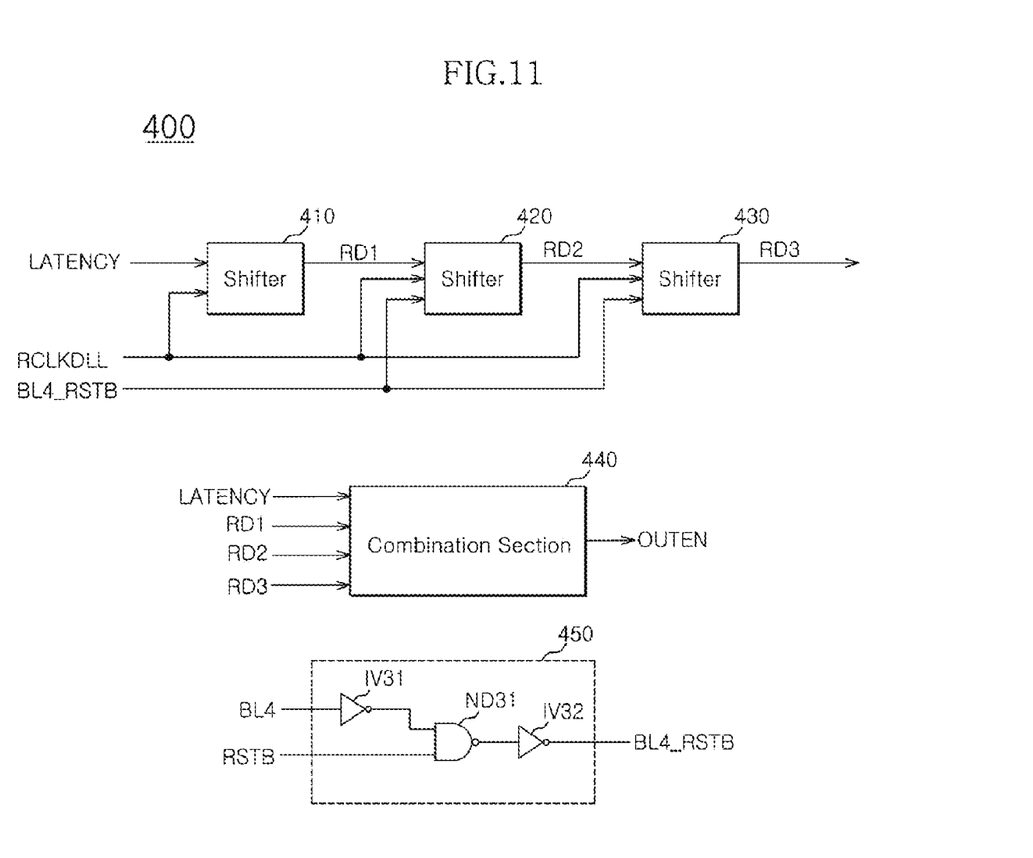
FIG. 11 is a block diagram of a data output enable signal generation unit of FIG. 7.

FIG. 11 is a block diagram of a data output enable signal generation unit of FIG. 7. Referring to FIG. 11, the data output enable signal generation unit 400 is configured to control the activation and deactivation timings of the data output enable signal OUTEN in response to the latency signal LATENCY and shifted signals RD1 to RD3. The shifted signals RD1 to RD3 are obtained by shifting the latency signal LATENCY based on the BL using the clock signal RCLKDLL.

The data output enable signal generation unit 400 includes a plurality of shifters 410 to 430, a combination section 400, and a control section 450.

The plurality of shifters 410 to 430 are configured to sequentially shift the latency signal LATENCY based on the clock signal RCLKDLL and generate the shifted signals RD1 to RD3.

The combination section 440 is configured to logically combine the latency signal LATENCY and the shifted signals RD1 to RD3, that is, perform an OR operation on the signals and generate the data output enable signal OUTEN.

In FIG. 11, the plurality of shifters 410 to 430 are implemented to perform both BL=4 and BL=8 operations. In the case of BL=4, the activation period of the data output enable signal OUTEN needs to be shorter than in the case of BL=8.

Therefore, the control section 450 is configured to generate a control signal BL4_RSTB for controlling the operations of the shifters 410 to 430 based on the BL.

The control section 450 logically combines the BL signal BL4 and the reset signal RSTB and generates the control signal BL4_RSTB. The control section 450 may include a plurality of inverters IV31 and IV32 and a NAND gate ND31.

The BL signal BL4 is at a high level in the case of BL=4, and at a low level in the case of BL=8. The reset signal RSTB is at a low level during a reset operation, and at a high level during any operation other than a reset operation.

When the reset signal RSTB is at a high level and BL=8, the control section 450 outputs a high-level control signal BL4_RSTB because the BL signal BL4 is at a low level.

Therefore, the plurality of shifters 410 to 430 perform normal operations based on the high-level control signal BL4_RSTB.

Meanwhile, the control section 450 outputs a low-level control signal BL4_RSTB since the BL signal BL4 is at a high level in the case of BL=4.

Therefore, the operations of the shifters 420 and 430 are stopped based on the low-level control signal BL4_RSTB.

Figure 12:
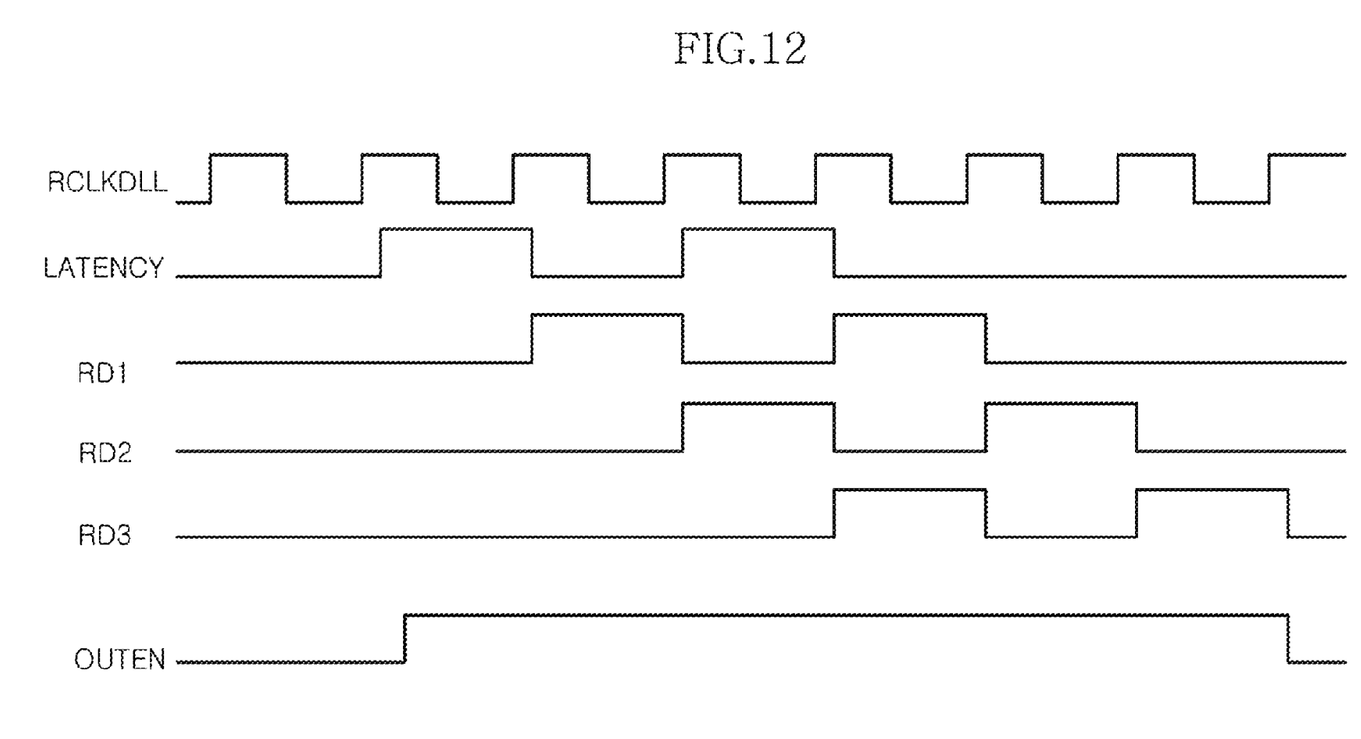
FIG. 12 is an operation timing diagram of the data output enable signal generation unit of FIG. 11.

FIG. 12 is an operation timing diagram of the data output enable signal generation unit of FIG. 11. Referring to FIG. 12, the plurality of shifted signals RD1 to RD3 are generated by the plurality of shifters 410 to 430 in the case of BL=8.

Furthermore, the latency signal LATENCY and the shifted signals RD1 to RD3 are logically combined by the combination section 440 to determine the activation period of the data output enable signal OUTEN which corresponds to BL=8.

According to the above-described embodiment, the activation timing of the data output enable signal OUTEN is determined by the latency signal LATENCY generated by the latency signal generation unit 200.

Furthermore, the data output enable signal generation unit 400 controls the deactivation timing of the data output enable signal OUTEN using the shifted signals RD1 to RD3 generated using the latency signal LATENCY.

Accordingly, the activation timing and the deactivation timing of the data output enable signal OUTEN are controlled independently. Therefore, it is possible to sufficiently secure both activation and deactivation timing margins without a trade-off problem.

While certain embodiments have been described above, it will be understood to those skilled in the art that the embodiments described are by way of example only. Accordingly, the output enable signal generation circuit described herein should not be limited based on the described embodiments. Rather, the output enable signal generation circuit described herein should only be limited in light of the claims that follow when taken in conjunction with the above description and accompanying drawings.

What is claimed is:

1. An output enable signal generation circuit of a semiconductor memory, comprising:
    a latency signal generation unit configured to generate a latency signal for designating activation timing of a data output enable signal in response to a read signal and a CAS latency signal; and
    a data output enable signal generation unit configured to control the activation timing and deactivation timing of the data output enable signal in response to the latency signal and a signal generated by shifting the latency signal based on a burst length (BL).

2. The output enable signal generation circuit according to claim 1, wherein the latency signal generation unit comprises:
    a plurality of preliminary latency signal generation sections configured to generate a plurality of preliminary latency signals in response to the read signal; and
    a selection section configured to select one of the preliminary latency signals in response to the CAS latency signal and output the selected signal as the latency signal.

3. The output enable signal generation circuit according to claim 2, wherein the plurality of preliminary latency signal generation sections are configured to sequentially latch the preliminary latency signals generated in response to the read signal using a clock signal and generate the plurality of preliminary latency signals.

4. The output enable signal generation circuit according to claim 3, wherein one of the preliminary latency signal generation sections is configured to repeat the read signal using a repeater and generate a preliminary latency signal.

5. The output enable signal generation circuit according to claim 1, wherein the data output enable signal generation unit comprises:
    a plurality of shifters configured to sequentially shift the latency signal based on a clock signal and generate shifted signals; and
    a combination section configured to logically combine the latency signal and the shifted signals and generate the data output enable signal.

6. The output enable signal generation circuit according to claim 5, wherein the number of the plurality of shifters is decided based on two or more BLs.

7. The output enable signal generation circuit according to claim 5, wherein the combination unit is configured to perform an OR operation on the latency signal and the shifted signals and generate the data output enable signal.

8. The output enable signal generation circuit according to claim 5, further comprising a control section configured to generate a control signal for controlling the operations of the shifters based on different BLs.

9. The output enable signal generation circuit according to claim 8, wherein the control section is configured to generate the control signal by logically combining a BL signal and a reset signal, the BL signal defining any one of the different BLs.

* * * * *